(12) United States Patent
Kimmlingen et al.

(10) Patent No.: US 7,538,551 B2
(45) Date of Patent: May 26, 2009

(54) MAGNETIC RESONANCE GRADIENT COIL SYSTEM HAVING A LIQUID ELECTRICAL CONDUCTOR

(75) Inventors: Ralph Kimmlingen, Nürnberg (DE); Andreas Krug, Fürth (DE); Johann Schuster, Oberasbach (DE); Axel Vom Endt, Erlangen (DE)

(73) Assignee: Siemens Aktiengesellschaft, Munich (DE)

( * ) Notice: Subject to any disclaimer, the term of this patent is extended or adjusted under 35 U.S.C. 154(b) by 295 days.

(21) Appl. No.: 11/522,228

(22) Filed: Sep. 15, 2006

(65) Prior Publication Data

US 2007/0066883 A1    Mar. 22, 2007

(30) Foreign Application Priority Data

Sep. 16, 2005    (DE)    ........................ 10 2005 044 406

(51) Int. Cl.
*G01V 3/00* (2006.01)
(52) U.S. Cl. .................................................... 324/318
(58) Field of Classification Search ......... 324/300–322; 600/410–435; 333/219–235; 343/729, 787, 343/866, 872, 895
See application file for complete search history.

(56) References Cited

U.S. PATENT DOCUMENTS

| | | | |
|---|---|---|---|
| 6,157,280 A | | 12/2000 | Arz et al. |
| 6,525,537 B2 * | | 2/2003 | Nerreter ...................... 324/322 |
| 6,812,705 B1 * | | 11/2004 | Sellers ........................ 324/318 |
| 7,135,863 B2 * | | 11/2006 | Arik et al. ................... 324/318 |
| 7,250,766 B2 * | | 7/2007 | Morita et al. ................ 324/318 |
| 7,301,343 B1 * | | 11/2007 | Sellers ........................ 324/318 |
| 7,370,789 B2 * | | 5/2008 | Ham ........................... 324/318 |
| 7,382,131 B2 * | | 6/2008 | Eberler et al. ................ 324/318 |

FOREIGN PATENT DOCUMENTS

EP    1 564 563    8/2005

\* cited by examiner

*Primary Examiner*—Brij B. Shrivastav
*Assistant Examiner*—Dixomara Vargas
(74) *Attorney, Agent, or Firm*—Schiff Hardin LLP

(57) ABSTRACT

In a gradient coil device having at least one conductor structure for use in a magnetic resonance apparatus, the conductor structure is a conductive liquid, contained in a tube system, that flows through the tube system in order to carry off heat lost during the operation of the gradient coil device.

20 Claims, 1 Drawing Sheet

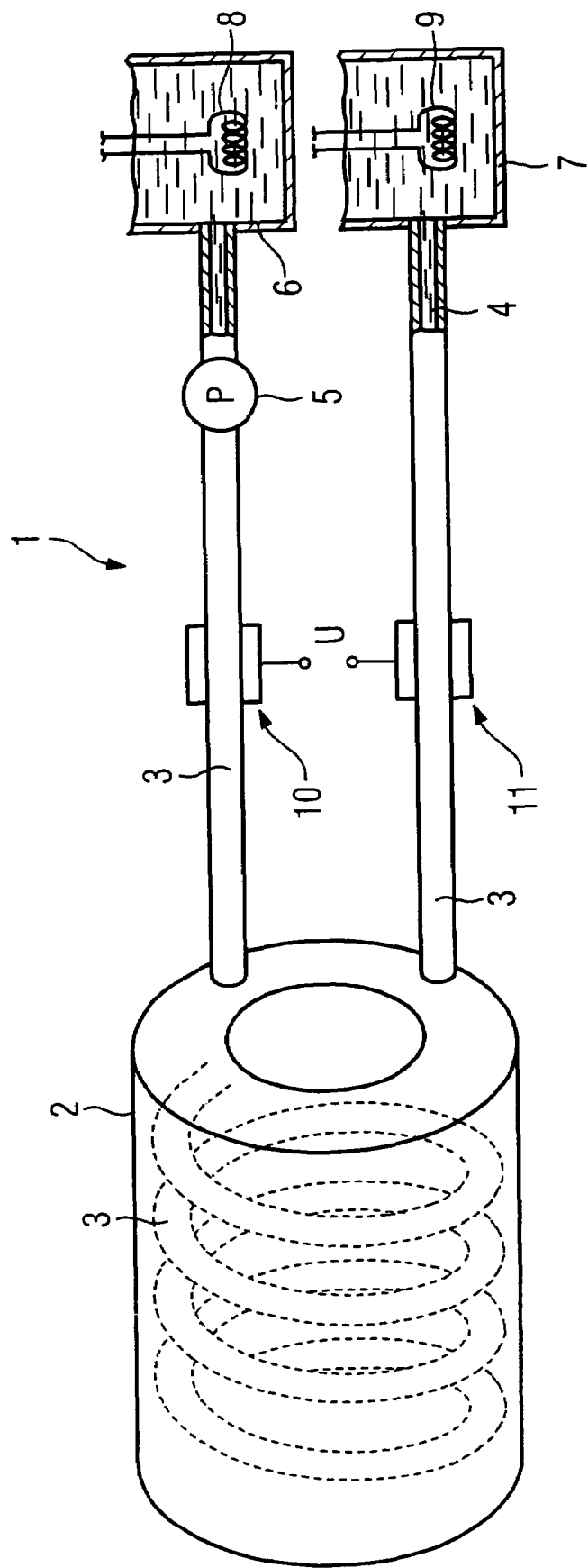

MAGNETIC RESONANCE GRADIENT COIL SYSTEM HAVING A LIQUID ELECTRICAL CONDUCTOR

BACKGROUND OF THE INVENTION

1. Field of the Invention

The present invention relates to a gradient coil system having at least one conductor structure for use in a magnetic resonance apparatus.

2. Description of the Prior Art

Gradient amplifiers used today in magnetic resonance apparatuses have sufficiently high power, with respect to current and voltage, so that the maximum gradient power is not limited by the power of the amplifier, but rather by the ohmic losses in the coil. Once the size of the gradient coil is predetermined, only a limited conductor cross-section is available, so that a further increase in the current density results in a greater power loss. This lost heat has to be dissipated as effectively and efficiently as possible. Conventionally, this has taken place by cooling the gradient coils with water. For this type of cooling, the limiting factor is the thermal resistance between the current conductors of the gradient coil and the cooling water. The heat is dissipated by relatively slow heat conduction or diffusion, and the separate cooling tubes also occupy a considerable amount of space.

SUMMARY OF THE INVENTION

An object of the present invention is to provide a gradient coil device of the type described above that is improved compared to conventional devices.

This object is achieved by a gradient coil system provided according to the invention in which the conductor structure is a conductive liquid, contained (enclosed) in a tube and/or pipe system, that flows through the tube system in order to dissipate the heat generated during the operation of the gradient coil device.

Thus, according to the present invention the conductor structure is formed by a liquid that flows through appropriate tubes of the gradient coil or coils at least during operation of the magnetic resonance apparatus. The current that produces the magnetic field is introduced into this liquid, causing a heating of the current conductor, i.e., here the conductor structure, which is liquid at operating temperature or room temperature. This results in a power loss that depends on the resistance of the liquid. The resulting heat is carried away immediately from the location at which it originates. According to the present invention, this dissipation is achieved by a guided flow of liquid, and not through heat conduction as was conventionally the case. In this way, it is possible to conduct the lost heat directly and immediately from the location at which it originates.

The cooling efficiency is limited only by the flow rate of the liquid conductor.

In the gradient coil device according to the present invention, the space that is required for cooling tubes in conventional systems can be used for additional conductor structures. In this manner, it is possible to achieve high flow rates, particularly if a liquid having low viscosity is used. In this way, the gradient coils can be operated with low inductance and high currents, i.e., with a high slew rate or rise speed.

The gradient coil device according to the present invention can have at least one pump for pumping the liquid with a particular flow rate through the tube and/or pipe arrangement. Given longer tubes, or tubes or pipes coupled one after the other, a number of pumps can be used in order to bring the flow rate over the entire tube length to a high target value as needed. In a tube or pipe system composed of separate tubes or pipes, for example for different coils of the device, in addition these separate tubes or pipes can each have its own pump. For high cooling efficiency, a high flow rate should be produced; for this reason, turbulences should be avoided. The flow rate and the geometry of the tube system or the pipes are therefore selected such that a laminar liquid flow is ensured.

The conductive liquid can be a metal that is liquid at room temperature or a liquid metal alloy, in particular a eutectic composed of the metals gallium, indium, and tin. Such a eutectic is commercially available under the trade name "Galinstan fluid." The use of this eutectic offers the advantage that the handling of the liquid does not present any significant risk if standard prescriptions are observed, and this material does not present any known health risks as long as it is handled appropriately and relevant health regulations are observed. The quantities used are below the range of acute toxicity.

Alternatively, a liquid metal can be used as a liquid conductor as long as there are no health or safety complications. Mercury would in principle be suitable, but will presumably not be used due to its toxic characteristics, given the availability of alternatives that do not present health risks. It is also possible to use gallium as the conductive liquid.

The conductor structure of the gradient coil device can be connected at each of its ends to reservoirs for the conductive liquid. The liquid metal or metal alloy is then pumped from one reservoir through the gradient coil into the other reservoir, and is then pumped back again. This procedure is repeated, so that a closed liquid circuit that would short the current circuit cannot arise. If the tube or pipe system has a number of separate tubes or pipes, it is possible to provide individual reservoirs for one or more of these additional tubes or pipes, between which the liquid flows back and forth.

In addition, at least one heat exchanger can be provided that is in contact with the liquid, in particular in at least one reservoir for the liquid. One or more heat exchangers are situated in each reservoir, to which the lost heat of the liquid is transferred. Providing the heat exchangers in one or more reservoirs can be easily structurally achieved, but in principle it is also possible to situate a metal body acting as a heat exchanger in areas of the tube or pipe system, at connecting points if necessary.

In addition, a conductive pipe, formed of a metal, or a brush can be provided for the introduction of the current into the liquid. If a current-conducting pipe segment made of a metal is selected, care must be taken that it does not form an alloy or amalgam with the liquid metal or metal alloy, and that in general the current-conducting pipe will not cause any chemical reactions or changes of the conductive liquid that could influence the liquid's suitability for conducting current. Using as a pipe or bar having a suitably shaped termination leading into the liquid, it can be ensured that the flow remains laminar. If a brush is used for the introduction of the current, care must be taken that the brush does not cause any disturbing turbulences in the liquid flow. Of course, the current can also be introduced into the liquid by a differently shaped element, but care must be taken that the flow of the liquid is not negatively influenced by the geometry of the body that introduces the current.

The tube and/or pipe system has fatigue or corrosion resistance to the conductive liquid, and/or has a coating for protection against the liquid. The selection of a material having fatigue resistance for the tube system reduces the probability of failure and makes less frequent maintenance possible. If the material of the tube system itself is not sufficiently strong or stable relative to the conductive liquid, a coating of the tube system can be provided that ensures a suitable degree of protection of the actual tube material relative to the liquid. Of course, it is also possible to apply the coating in addition to the selection of a material having fatigue resistance, in order to provide a higher degree of security for the avoidance of undesirable reactions with the liquid, or for protection against the escape of liquid into the environment.

The tube and/or pipe system can be made of plastic and/or ceramic material. Plastic tubes offer the advantage of a high degree of flexibility, and a wide range of properties that can be realized through the selection of different plastic compounds. Plastic tubes thus can be constructed so as to be similar to previously used cooling tubes in magnetic resonance apparatuses. The individual tubes can be manufactured with lengths of, for example, more than one meter, or significantly longer or shorter. Because the heat that arises from the liquid flow is carried away immediately from the location at which it originates, it is not necessary for the tubes themselves to have any particular heat-conducting properties.

In principle, for the tube and/or pipe system is also possible to use a ceramic material, either exclusively or in addition to the plastic material, but a ceramic pipe offers a lower degree of flexibility of the system in the available space, or must be manufactured for an exact fit.

The tube systems or pipes, if necessary, can be fashioned in the form of saddle coils, i.e., in a shape that is useful for the gradient coils. Adaptation to the particular details of the individual magnetic resonance apparatus is possible. If necessary, in the gradient coil device tubes and/or pipes can be combined, or corresponding segments can be connected to one another.

The tube or pipe of the tube and/or pipe system preferably has a diameter of at least 2 mm or greater, in particular 4 mm or 6 mm. The diameter is to be selected such that the lost power can be optimally conducted away from its point of origination, without resulting in disturbing turbulences or swirling in the liquid flow. Diameters significantly larger than 6 mm, e.g. 20 mm, are also possible. Possible flow rates for such tube or pipe diameters are in the range of a few tens of liters per minute; other flow rates can be achieved depending on the tube or pipe and the liquid.

In addition, a device for preparing the conductive liquid and/or for influencing chemical processes with the participation of the conductive liquid can be provided, in particular a device for ion recombination and/or a catalyzer. In this way, decomposition processes resulting from interactions that may take place with the tube material, or simply with the passage of time, can be controlled and will not have negative effects on the functional capability of the gradient coil device. Possible ionization processes, for example at the connections of the tube and/or pipe system to the amplifier, which connections must come into contact with the conductive liquid, can be kept controllable by preparing the conductive liquid, for example using an ion recombination device, or such changes can be reversed. Using a catalyzer, it is possible to influence the speed of such reactions in such a way that undesirable chemical processes are slowed such that they do not have any negative effects, while other processes that do not have negative effects on the dissipation of the lost heat are accelerated, or are caused to occur.

In a magnetic resonance apparatus having a gradient coil device of the type described above, the heat loss can be efficiently minimized by a guided flow of the conductive liquid with a sufficiently high speed. It does not present a problem if the power loss is greater than is the case with the use of conventional copper conductors, because, for example, the resistance of the liquid material is higher. In general, this can be easily compensated by the advantages of the direct conduction away using the directed flow, so that a more efficient heat elimination results than is the case in conventional gradient coil devices. Due to the fact that spaces that were conventionally used for cooling tubes can now be used for conductor structures, overall a better use of space in the gradient coil device is achieved, so that the design of the magnetic resonance apparatus as a whole can be optimized.

The gradient coil device can have a temperature control or regulation unit for adapting the flow speed dependent on the temperature of the liquid. Using one or more temperature sensors situated in the liquid, the temperature can be measured continuously or at determined time intervals, and can be monitored in this way. If the temperature of the liquid rises above a particular still-permissible value, the temperature control or regulation device acts to adapt the flow speed of the liquid. For this purpose, a pump system can be controlled such that the pump power is increased, so that the flow rate likewise increases, and the lost heat is dissipated faster. If, after a certain period of time, the temperature falls back below a particular value, the flow rate can be lowered again by the temperature control or regulation device; for this purpose, the pump system or a device for regulating the flow rate of the liquid is operated at lower power.

DESCRIPTION OF THE DRAWING

The single figure shows a gradient coil device according to the present invention.

DESCRIPTION OF THE PREFERRED EMBODIMENTS

The gradient coil device 1 has a gradient coil system 2 that is formed by a conductive liquid 4 housed in a tube system 3. Conductive liquid 4 flows through tube system 3, the directed flow being achieved by a pump 5 that is provided in the area of the feed-in of the tube system 3 to the gradient coil system 2, i.e., in the vicinity of one end of the tube system 3. The power of the pump 5 is such that the conductive liquid 4 can flow through the tube system 3 at a sufficiently high rate. In order to increase efficiency, additional pumps 5 can be provided that are not shown. The conductive liquid 4 is a liquid metal alloy having the property that use thereof in health-critical areas is largely safe. The conductor structure formed by conductive liquid 4 in the connection with tube system 3 is connected at each of its ends to two reservoirs 6 and 7 between which the conductive liquid 4 is pumped back and forth by the pump 5, so that a closed liquid circuit does not arise that would short the current circuit.

In reservoirs 6 and 7, heat exchangers 8 and 9 are respectively provided that can accommodate the heat carried away from the location at which it originates. The direct carrying away of the lost heat from the location at which it originates results in an efficient heat dissipation that no longer depends on comparatively slow heat conduction.

In addition, in the end area of the tube system 3, terminals 10 and 11, having a voltage U between them, are provided via which the connection to the gradient amplifier is created, this amplifier being fashioned as a general-purpose amplifier.

In order to counteract possible decomposition or ionization processes in the conductive liquid 4 that can occur, for example, in the area of terminals 10 and 11 to the gradient amplifier, a device (not shown) is provided for preparing the conductive liquid. During the introduction of current into the liquid circuit, care is taken to ensure that the liquid flow remains as laminar as possible.

In addition, a temperature control or regulating device (not shown) is provided that uses temperature sensors to measure the temperature of the conductive liquid 4. If the temperature is too high, the temperature control or regulating device is used to control the pump 5 in order to operate it with higher power, to achieve a faster flow. Conversely, the pump power can be reduced if the temperature has decreased below a particular value.

The high flow rates that can be realized for the conductive liquid 4 in the tube system 3 enable the heat that arises to be transported away quickly from the location at which it originates, resulting in a high degree of cooling efficiency. The coil system 2 can thus be operated with high currents and low inductance.

Although modifications and changes may be suggested by those skilled in the art, it is the intention of the inventors to embody within the patent warranted hereon all changes and modifications as reasonably and properly come within the scope of their contribution to the art.

We claim as our invention:

1. A gradient coil system for a magnetic resonance apparatus, comprising:
   a tube system configured in a pattern conforming to a conductor path of a magnetic resonance gradient coil; and
   an electrically conductive liquid flowing through said tube system, said electrically conductive liquid and said tube system, in combination, forming a magnetic resonance gradient coil having a coil conductor consisting of said electronically conductive fluid, and said electrically conductive liquid having thermal properties to promote dissipation of heat arising during operation of said gradient coil.

2. A gradient coil system as claimed in claim 1 comprising at least one pump in fluid communication with said tube system that pumps said electrically conductive liquid through said tube system.

3. A gradient coil system as claimed in claim 2 wherein said pump pumps said electrically conductive liquid through said tube system at a predetermined flow rate.

4. A gradient coil system as claimed in claim 1 wherein said electrically conductive liquid is a metal that is liquid at room temperature.

5. A gradient coil system as claimed in claim 1 wherein said electrically conductive liquid is a liquid metal alloy.

6. A gradient coil system as claimed in claim 5 wherein said liquid metal alloy comprises gallium, indium and tin.

7. A gradient coil system as claimed in claim 1 wherein said tube system has opposite ends, and wherein said gradient coil system comprises respective reservoirs for said electrically conductive liquid, said reservoirs being in fluid communication with said tube system respectively at said ends thereof.

8. A gradient coil system as claimed in claim 1 comprising at least one reservoir for said electrically conductive liquid, and a heat exchanger in thermal communication with said electrically conductive liquid in at said least one reservoir.

9. A gradient coil system as claimed in claim 1 comprising a heat exchanger in thermal communication with said electrically conductive liquid.

10. A gradient coil system as claimed in claim 1 comprising a current-conducting metallic pipe in electrical contact with said electrically conductive liquid, for introducing electrical current into said electrically conductive liquid.

11. A gradient coil system as claimed in claim 1 comprising an electrically conductive brush in electrical contact with said electrically conductive liquid, to introduce electrical current into said electrically conductive liquid.

12. A gradient coil system as claimed in claim 1 wherein said tube system is composed of a material having fatigue resistance to said electrically conductive liquid.

13. A gradient coil system as claimed in claim 1 wherein said tube system is formed of tube material, and comprises an interior coating for protecting said tube material from said electrically conductive liquid.

14. A gradient coil system as claimed in claim 1 wherein said tube system is comprised of a material selected from the group consisting of plastic and ceramic.

15. A gradient coil system as claimed in claim 1 wherein said tube system has an inner diameter greater than 2 mm.

16. A gradient coil system as claimed in claim 1 wherein said tube system has an inner diameter greater than 4 mm.

17. A gradient coil system as claimed in claim 1 wherein said tube system has an inner diameter greater than 6 mm.

18. A gradient coil system as claimed in claim 1 comprising a preparation device that prepares said electrically conductive liquid prior to introduction of said electrically conductive liquid into said tube system, said preparation device being selected from the group consisting of ion recombination devices and catalyzer devices.

19. A gradient coil system for a magnetic resonance apparatus, comprising:
   a tube system;
   an electrically conductive liquid flowing through said tube system;
   said tube system having a configuration pattern that produces a magnetic field having a field distribution conforming to a magnetic resonance gradient field when said electrically conductive liquid in said tube system is supplied with current; and
   said electrically conductive liquid having thermal properties that promote dissipation of heat that arises when said electrically conductive liquid is supplied with current.

20. A method for producing a magnetic resonance gradient field, comprising the steps of:
   configuring a tube system in a pattern conforming to a conductor path of a magnetic resonance gradient coil;
   circulating electrically conductive fluid through said tube system and supplying said electrically conductive fluid circulating in said tube system with electrical current to produce a magnetic field having a field distribution conforming to a magnetic resonance gradient field; and
   dissipating heat from said electrically conductive liquid that arises when said electrically conductive liquid is supplied with current, by employing a heat dissipating liquid, as set electrically conductive liquid, that has thermal properties to promote dissipation of said heat.

* * * * *